(12) United States Patent
Combi et al.

(10) Patent No.: US 6,869,856 B2
(45) Date of Patent: Mar. 22, 2005

(54) PROCESS FOR MANUFACTURING A SEMICONDUCTOR WAFER INTEGRATING ELECTRONIC DEVICES INCLUDING A STRUCTURE FOR ELECTROMAGNETIC DECOUPLING

(75) Inventors: Chantal Combi, Oggiono (IT); Matteo Fiorito, Trieste (IT); Marta Mottura, Melegnano (IT); Giuseppe Visalli, Bareggio (IT); Benedetto Vigna, Pietrapertosa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/284,031

(22) Filed: Oct. 29, 2002

(65) Prior Publication Data

US 2003/0113981 A1 Jun. 19, 2003

(30) Foreign Application Priority Data

Oct. 30, 2001 (IT) .................................... TO2001A1038

(51) Int. Cl.[7] ............................................. H01L 21/76
(52) U.S. Cl. ...................... 438/410; 438/238; 438/453; 438/620
(58) Field of Search ........................... 438/42, 98, 108, 438/119, 238, 353, 410, 411, 421, 422, 426, 431, 439, 453, 619, 620, 795

(56) References Cited

U.S. PATENT DOCUMENTS

| | | | |
|---|---|---|---|
| 3,808,470 A | * 4/1974 | Kniefkamp | ................. 257/473 |
| 4,735,901 A | 4/1988 | Kurtz et al. | ............. 435/172.3 |
| 4,791,073 A | 12/1988 | Nagy et al. | .................... 437/67 |
| 4,908,328 A | * 3/1990 | Hu et al. | .................... 438/269 |

(List continued on next page.)

FOREIGN PATENT DOCUMENTS

| | | |
|---|---|---|
| EP | 0 214 512 A2 | 3/1987 |
| EP | 0996 149 A1 | 4/2000 |
| JP | 56-94646 | 7/1981 |
| JP | 59-112633 | 6/1984 |
| JP | 5-190663 | 7/1993 |

OTHER PUBLICATIONS

Baliga, B. (ed.), "*Epitaxial Silicon Technology*," Academic Press, Inc. Orlando, Florida, 1986, Chap. V, "Silicon–On–Insulator Epitaxy."

Burghartz, J. et al., "Spiral Inductors and Transmission Lines in Silicon Technology Using Copper–Damascene Interconnects and Low–Loss Substrates," *IEEE Trans. on Microwave Theory and Techniques,* 45(10):1961–1968, Oct. 1997.

Lopez–Villegas, J. et al., "Improvement of the Quality Factor of RF Integrated Inductors by Layout Optimization," *IEEE Trans. on Microwave Theory and Techniques,* 48(1):76–83, Jan. 2000.

(List continued on next page.)

*Primary Examiner*—John F. Niebling
*Assistant Examiner*—Stanetta Isaac
(74) *Attorney, Agent, or Firm*—Lisa K. Jorgenson; Robert Iannucci; Seed IP Law Group PLLC (57) ABSTRACT

A process for manufacturing a semiconductor wafer integrating electronic devices and a structure for electromagnetic decoupling are disclosed. The method includes providing a wafer of semiconductor material having a substrate; forming a plurality of first mutually adjacent trenches, open on a first face of the wafer, which have a depth and a width and define walls); by thermal oxidation, completely oxidizing the walls and filling at least partially the first trenches, so as to form an insulating structure of dielectric material; and removing one portion of the substrate comprised between the insulating structure and a second face of the wafer, opposite to the first face of the wafer.

38 Claims, 7 Drawing Sheets

U.S. PATENT DOCUMENTS

| | | | | |
|---|---|---|---|---|
| 5,189,501 | A | | 2/1993 | Kawamura et al. ......... 257/647 |
| 5,374,583 | A | | 12/1994 | Lur et al. ..................... 437/67 |
| 5,393,373 | A | * | 2/1995 | Jun et al. ..................... 438/396 |
| 5,424,245 | A | * | 6/1995 | Gurtler et al. .............. 438/107 |
| 5,450,263 | A | | 9/1995 | Desaigoudar et al. ....... 360/110 |
| 5,472,903 | A | * | 12/1995 | Lur et al. .................... 438/431 |
| 5,492,858 | A | * | 2/1996 | Bose et al. .................. 438/437 |
| 5,512,161 | A | * | 4/1996 | Dinglreiter et al. ........... 205/67 |
| 5,627,106 | A | * | 5/1997 | Hsu ............................. 438/459 |
| 5,728,624 | A | * | 3/1998 | Linn et al. .................. 438/459 |
| 5,747,377 | A | * | 5/1998 | Wu ............................. 438/444 |
| 5,756,389 | A | * | 5/1998 | Lim et al. ................... 438/425 |
| 5,804,491 | A | | 9/1998 | Ahn ............................ 438/425 |
| 5,814,889 | A | * | 9/1998 | Gaul ........................... 257/773 |
| 5,892,425 | A | * | 4/1999 | Kuhn et al. ................. 336/200 |
| 5,897,361 | A | | 4/1999 | Egawa ........................ 438/435 |
| 6,057,211 | A | | 5/2000 | Schwalke .................... 438/428 |
| 6,057,241 | A | | 5/2000 | Matsuda et al. ............ 438/689 |
| 6,087,719 | A | * | 7/2000 | Tsunashima ................ 257/686 |
| 6,140,197 | A | * | 10/2000 | Chu et al. .................... 438/381 |
| 6,143,836 | A | * | 11/2000 | Aizawa et al. .............. 525/421 |
| 6,159,664 | A | * | 12/2000 | Reuhman-Huisken et al. ........................... 430/321 |
| 6,221,751 | B1 | * | 4/2001 | Chen et al. ................. 438/612 |
| 6,362,525 | B1 | * | 3/2002 | Rahim ......................... 257/738 |
| 6,387,747 | B1 | * | 5/2002 | Cha et al. ................... 438/238 |
| 6,429,504 | B1 | * | 8/2002 | Beaussart et al. ........... 257/531 |
| 6,455,393 | B1 | * | 9/2002 | Swanson .................... 438/422 |
| 6,472,254 | B2 | * | 10/2002 | Cantarini et al. ........... 438/138 |
| 6,524,890 | B2 | * | 2/2003 | Ueda et al. .................. 438/113 |
| 6,534,406 | B1 | * | 3/2003 | Howard et al. ............. 438/687 |
| 6,599,812 | B1 | * | 7/2003 | Palara ......................... 438/424 |
| 6,613,644 | B2 | * | 9/2003 | Lachner ...................... 438/424 |
| 6,613,652 | B2 | * | 9/2003 | Lim et al. ................... 438/459 |
| 6,664,126 | B1 | * | 12/2003 | Devoe et al. ................. 438/50 |

OTHER PUBLICATIONS

Chang, J. et al., "Large Suspended Inductors on Silicon and Their Use in a 2-$\mu$m CMOS RF Amplifier," *IEEE Electron Device Letters*, 14(5):246–248, May 1993.

Yoon, J. et al., "Surface Micromachined Solenoid On–Si and On–Glass Inductors for RF Applications," *IEEE Electron Device Letters*, 20(9):487–489, Sep. 1999.

Kamogawa, K. et al., "A Novel High–Q and Wide–Frequency–Range Inductor Using Si 3–D MMIC Technology," *IEEE Microwave and Guided Wave Letters*, 9(1):16–18, Jan. 1999.

Xie, Y. et al., "An Approach for Fabricating High Performance Inductors on Low Resistivity Substrates," *IEEE Journ. Of Solid State Circuits*, pp. 88–91, 1998.

Oppermann, H. et al., "Advanced Flip Chip Technologies in RF, Microwave, and MEMS Applications," *Proceedings of SPIE* vol. 4019, pp. 308–314, Apr. 2000.

Wolf, S., "Silicon Processing for the VLSI–ERA: vol. 2–Process Integration," Lattice Press, pp. 51–58, 1990.

* cited by examiner

PROCESS FOR MANUFACTURING A SEMICONDUCTOR WAFER INTEGRATING ELECTRONIC DEVICES INCLUDING A STRUCTURE FOR ELECTROMAGNETIC DECOUPLING

BACKGROUND OF THE INVENTION

1. Field of the Invention

The present invention relates to a process for manufacturing a semiconductor wafer integrating electronic devices and a structure for electromagnetic decoupling.

2. Description of the Related Art

As is known, integration of electronic devices in a single wafer of semiconductor material requires particular solutions in order to decrease the effects of electromagnetic coupling due to the capacitances and mutual parasitic inductances that may form between the regions in which the active and/or passive components and the substrate of the wafer are made. These capacitances and mutual parasitic inductances, in fact, alter the characteristics of the devices and lead to an increase in the overall power dissipation. In addition, the problem of electromagnetic coupling with the substrate is particularly significant in the case of pure passive components, i.e., of those components that are designed to have a behavior of an exclusively capacitive, inductive, or resistive type in a wide frequency band.

The solutions so far proposed envisage the use of dielectric passivation layers which separate the regions comprising the components from the substrate. However, the fabrication processes currently available present limits which, in practice, do not enable formation of dielectric layers having satisfactory characteristics of insulation.

One first solution, for example, lies in growing a thermal-oxide layer of a thickness of a few micron on a surface of the wafer. In this case, however, the time required for carrying out the oxidation step is extremely long, on account of the low diffusiveness of the reagents, and the process is too slow to be exploited at an industrial level. Alternatively, it has been proposed to use thick layers of deposited oxide, which can be made in slightly shorter times. However, the improvement that is obtained is not yet sufficient and, moreover, the dielectric characteristics of the deposited oxide are inferior to those of the thermal oxide.

According to a different solution, silicon-on-insulator (SOI) semiconductor wafers are used, namely wafers incorporating a layer of buried oxide which separates the substrate from a monocrystalline- or polycrystalline-silicon region in which the components are formed. SOI wafers first of all present the disadvantage of being very costly, in so far as their preparation requires the use of complex processes; in the second place, the buried-oxide layers of SOI wafers currently available are not sufficiently thick to guarantee adequate electromagnetic insulation between the substrate and the components.

A further solution involves the fabrication of dielectric layers made of polymeric material. In this way, it is possible to reach even very high thicknesses and ones that are sufficient for reducing electromagnetic coupling considerably. In addition, it is possible to make passive devices suspended over the substrate (the so-called "air-bridge" devices), with the aim, above all, of minimizing the parasitic couplings of a capacitive type. The fabrication of thick polymeric layers is, however, disadvantageous because it requires the use of technologies and processing steps that are not standard in the sector of micro-electronics. Also in this case, then, the production cost of the device is very high. In addition, air-bridge devices cannot be passivated, entail the use of cavity packagings and are far from easy to reproduce.

The problem of electromagnetic coupling, then, afflicts particularly the inductors, so much so that they are not normally integrated on semiconductor wafers. In fact, precisely on account of the electromagnetic coupling between the turns and the substrate, at present it is not possible to produce inductors with a high figure of merit. On the other hand, recourse to alternative solutions, such as the use of highly resistive substrates, the formation of cavities that underlie the inductors, or recourse to techniques of three-dimensional lithography has the drawbacks already described (non-standard technologies or technologies that are not compatible with the fabrication of integrated circuits, high costs, packaging, etc.).

BRIEF SUMMARY OF THE INVENTION

An embodiment of the present invention provides a process for manufacturing a semiconductor wafer that will produce integrated electronic devices with improved electromagnetic decoupling.

According to an embodiment of the present invention provides a process for manufacturing a semiconductor wafer integrating electronic devices and a structure for electromagnetic decoupling. The process for manufacturing a integrated electronic component and a structure for electromagnetic decoupling in a semiconductor substrate region of a wafer. The process includes the steps of forming a plurality of first mutually adjacent trenches in the semiconductor substrate region. The plurality of adjacent trenches are open on a first face of the wafer and have a depth and a width to define walls of the trench. The walls of the trenches are oxidized to partially fill the trenches so as to form an insulating structure of a dielectric material. The insulating structure is structured to extend through the wafer and be exposed to both the top and bottom surfaces of the wafer by removing a portion of the semiconductor substrate of the wafer between the insulating structure and bottom of the wafer.

The resulting circuit structure provides for electrically and magnetically separated regions on the top surface of the wafer for forming integrated circuits, high power components or passive components. Alternatively, integrated circuits can be formed on the top surface in either insulating structure or the semiconductor substrate region and on the bottom surface of the wafer.

BRIEF DESCRIPTION OF THE SEVERAL VIEWS OF THE DRAWING(S)

For a better understanding of the present invention, some embodiments thereof are now described, purely by way of non-limiting example, with reference to the attached drawings, in which.

DETAILED DESCRIPTION OF THE INVENTION

In the embodiment described hereinafter, the process that forms the subject of the present invention is used for the fabrication of an inductor with a high figure of merit. This must not, however, be considered in any way limiting, since the process can be advantageously used for the fabrication of devices of various kinds, whether active or passive.

With reference to FIGS. 1–13, a wafer 1 of semiconductor material, such as monocrystalline silicon, comprises a substrate 2 having a doping density of, for example, $10^{19}$ atoms/cm$^3$.

Figure 1:
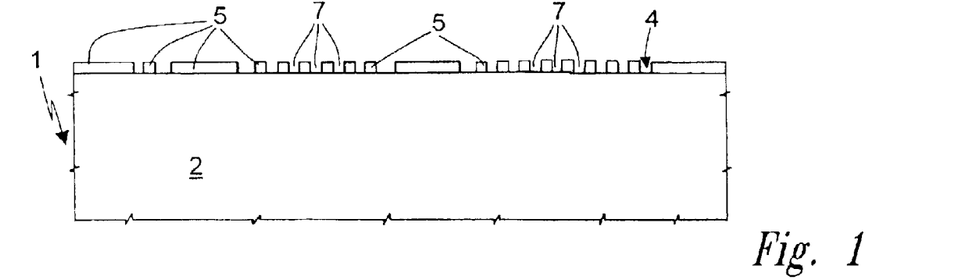
FIG. 1 is a cross-sectional view of a wafer of semiconductor material, in an initial fabrication step according to a first embodiment of the present invention.
Figure 2:
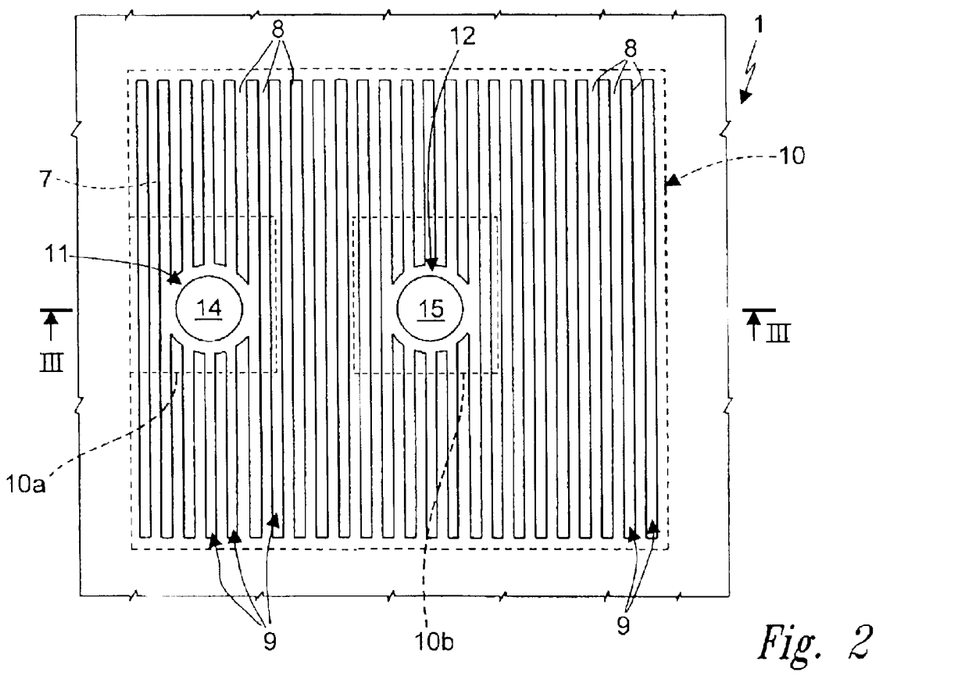
FIG. 2 is a top plan view of the wafer of FIG. 1 in a subsequent fabrication step.
Figure 3:
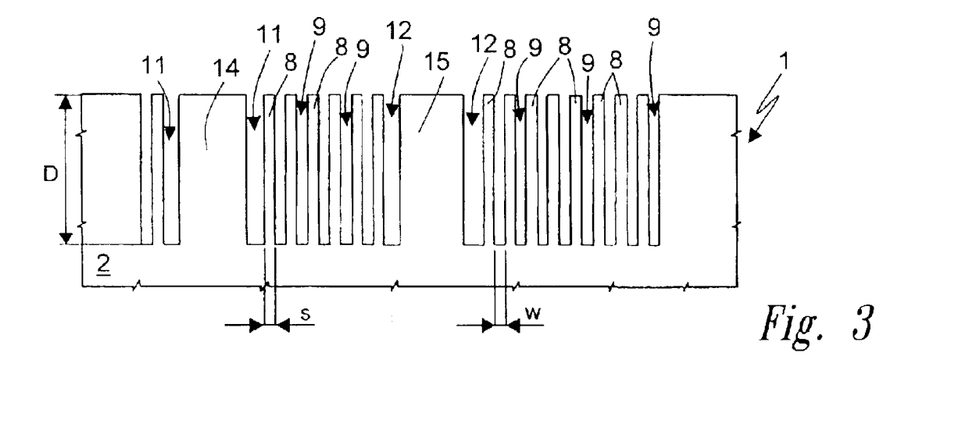
FIG. 3 is a cross-sectional view of the wafer of FIG. 2 according to a plane of trace III—III.
Figure 4:
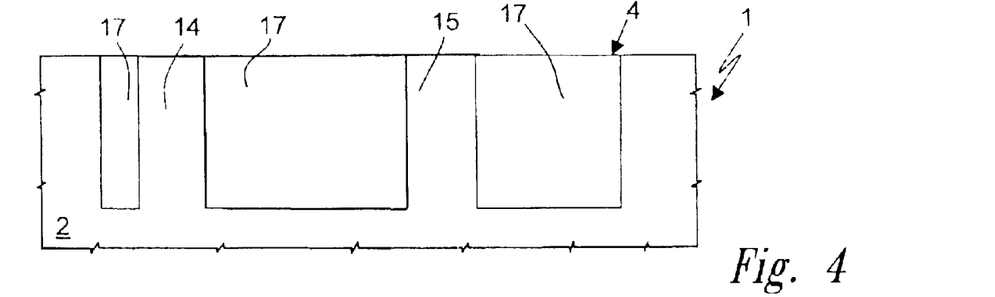
FIG. 4 is the same view as FIG. 3, in a subsequent step of fabrication of the wafer.
Figure 5:
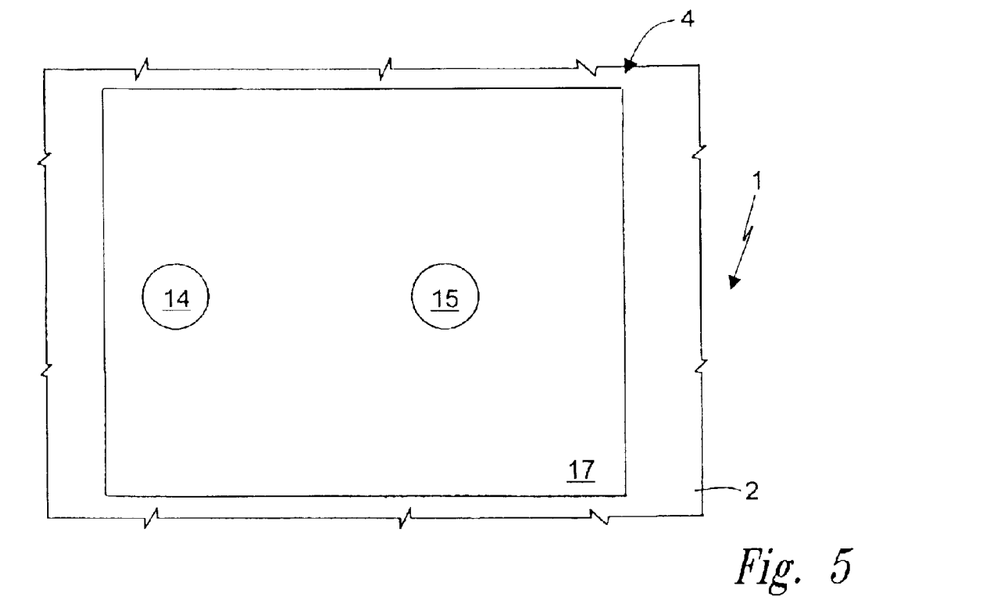
FIG. 5 is a top plan view of the wafer of FIG. 4.

Initially, a deep trench etch is performed. For this purpose, an oxide layer is deposited on a first face 4 of the wafer 1 and is then defined by means of a photolithographic process, so as to form a trench mask 5, which leaves partially uncovered a region 7 in which an insulating region will have to be subsequently formed (FIG. 1). Next (FIGS. 2 and 3), the regions 7 of the wafer 1 that have been left uncovered by the trench mask 5 are etched anisotropically as far as a pre-set depth D (for example, 100 μm), preferably by means of plasma etching. The trench mask 5 is then removed. In greater detail, in this step a plurality of mutually adjacent rectilinear trenches 9 having a depth D and a width W of, for instance, 2.5 μm are formed. The rectilinear trenches 9 are open on a first face 4 of the wafer 1, extend parallel to one another, and define, in pairs, walls 8 that are set alongside one another and have a thickness S equal to the width W, so as to form a grid 10, which preferably has, in plan view, a rectangular or square envelope. In addition, the walls 8 and the rectilinear trenches 9 extend without any interruption between the opposite sides of the grid 10, except for an edge portion 10a and a central portion 10b of the grid 10 as shown in FIG. 2. In particular, during the trench-etching step, a first annular trench 11 and a second annular trench 12, which also have a width W and a depth D, are opened in the edge portion 10a and in the central portion 10b, respectively, of the grid 10. The first annular trench 11 and the second annular trench 12 internally delimit a first conductive region 14 and a second conductive region 15, respectively, which are continuous and have a diameter of, for example, 80 μm. In addition, the first annular trench 11 and second annular trench 12 interrupt the walls 8 and the rectilinear trenches 9 formed in the edge portion 10a and in the central portion 10b of the grid 10.

Next (FIGS. 4 and 5), a thermal-oxidation step is carried out, in which the walls 8 are completely oxidized. Since the thermal oxide grows substantially for one half inside the silicon and for one half outwards, and since, moreover, the width W of the trenches 9, 11, 12 is equal to the thickness S of the walls 8, in this step the rectilinear trenches 9 and the annular trenches 11, 12 are completely filled with silicon dioxide. During the thermal-oxidation step, also a superficial oxide layer is formed, which is subsequently removed, so as to uncover the first face 4 of the wafer 1 and, in particular, the first conductive region 14 and second conductive region 15. In this way, inside the wafer 1 there is formed a silicon-dioxide insulating structure 17 having a substantially parallel-pipedal shape. In particular, the insulating structure 17 has a height equal to the depth D of the trenches 9, 11, 12 and, in plan view, has a shape which substantially coincides with the envelope of the grid 10. In addition, the insulating structure 17 is traversed, in a direction orthogonal to the first face 4, by the first conductive region 14 and second conductive region 15, which form respective through conductive vias.

Figure 6:
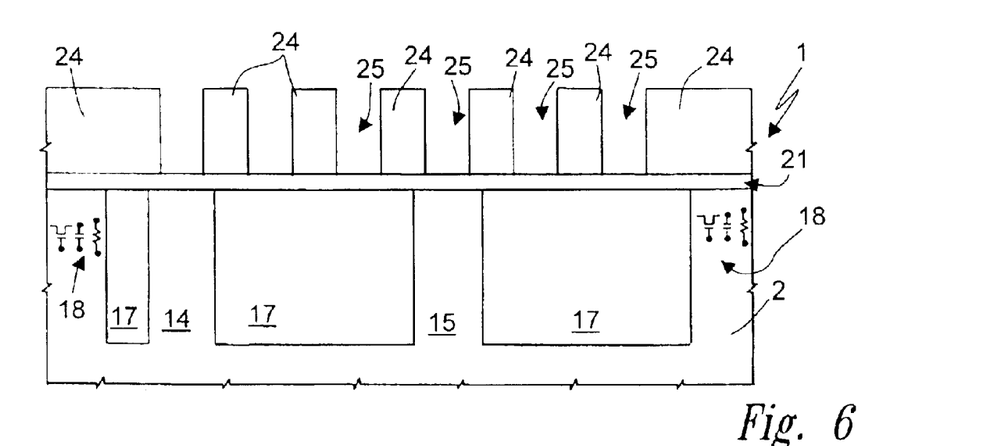
FIG. 6 is the same view as FIG. 4, in a subsequent step of fabrication of the wafer.

Using standard processing steps, in a way known to a person skilled in the art, integrated circuits 18, here schematically represented by active and passive components as shown in FIG. 6, are then formed in the substrate 2, in the proximity of the face 4.

Figure 7:
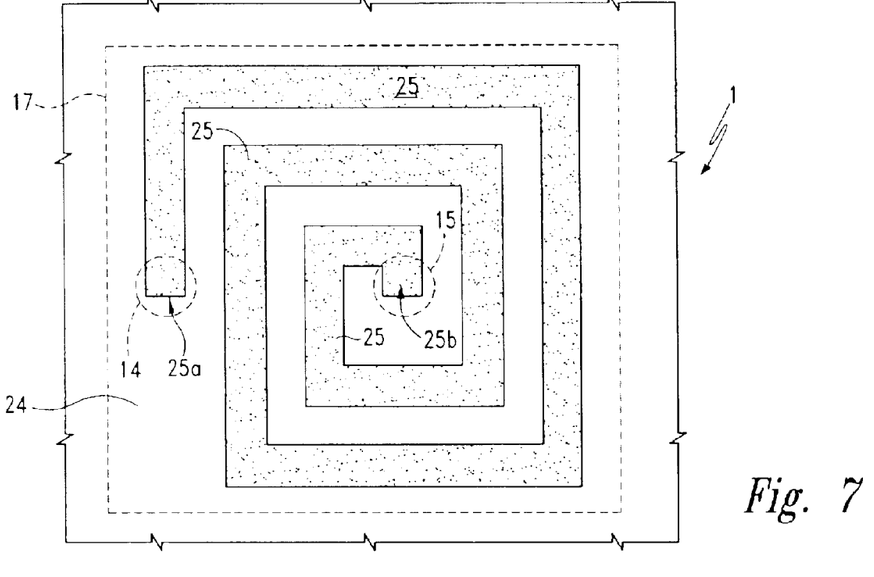
FIG. 7 is a top plan view of the wafer of FIG. 6.

Next, a germ 21 of conductive material, for instance copper, is deposited on the first face 4 of the wafer 1, so as to coat it completely for a thickness of approximately 100–200 nm and to set in contact the first conductive region 14 and the second conductive region 15 (FIG. 6). Then a resist layer is deposited on the germ layer 21 and is defined so as to form a matrix 24 having a spiral-shaped opening 25. In particular, the opening 25 forms a predetermined number of turns and has an outer end 25a, in a position corresponding to the first conductive region 14, and an inner end 25b, in a position corresponding to the second conductive region 15 (FIG. 7).

Figure 8:
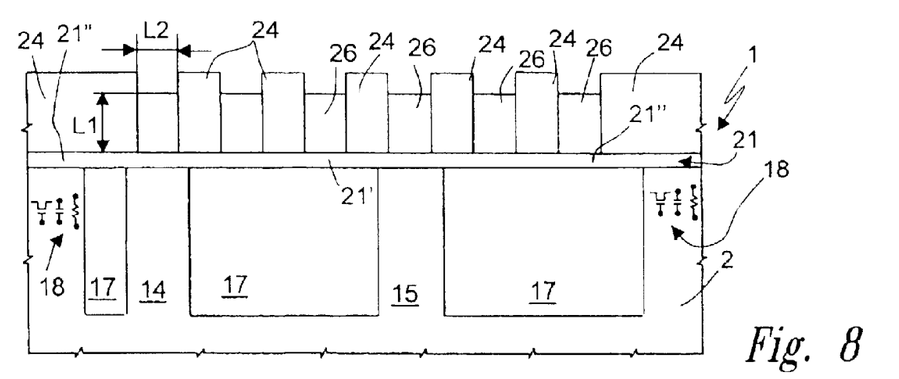
FIGS. 8–11 show the same view as FIG. 6, in successive steps of fabrication of the wafer.

Next, a copper inductor 26 is galvanically grown inside the opening 25, in contact with uncovered portions 21' of the germ layer 21 (FIG. 8). Preferably, a cross section of the inductor 26 has a first dimension L1, which is perpendicular to the first face 4 of the wafer 1, greater than a second dimension L2, which is parallel to the first face 4.

Figure 9:
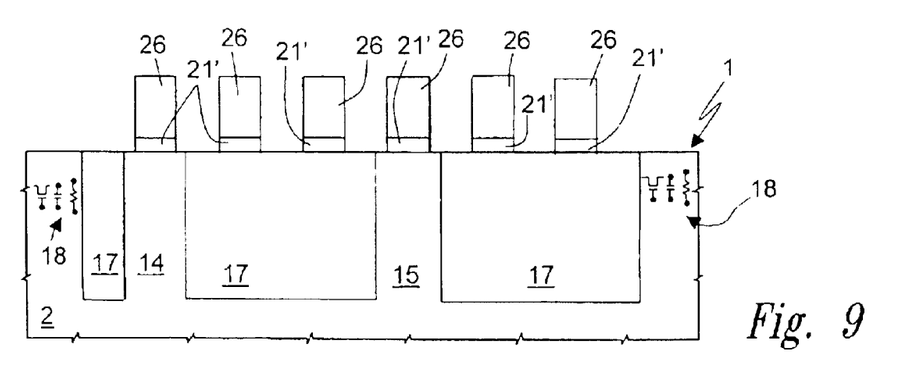
Figure 10:
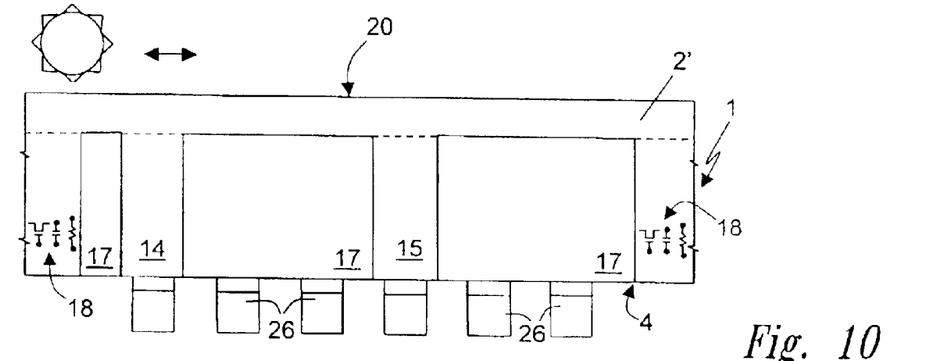

The matrix 24 is then removed, and portions 21" of the germ layer 21 that are not covered by the inductor 26 are selectively removed, as shown in FIG. 9. Preferably, a dry etch is carried out in this step, since it is easier to control and less sensitive to possible variations in the etching time.

At the end of this step, the wafer 1 comprises the monocrystalline-silicon substrate 2, the insulating structure 17, formed inside the substrate 2 and surfacing on the first face 4, the integrated circuits 18, and the inductor 26.

Figure 11:
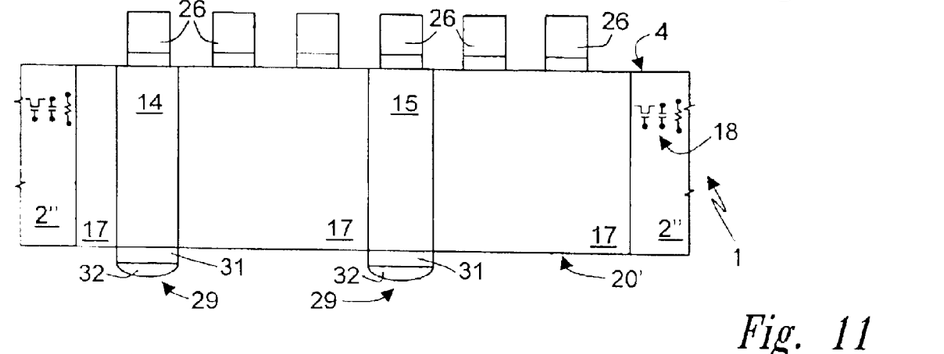
Figure 12:
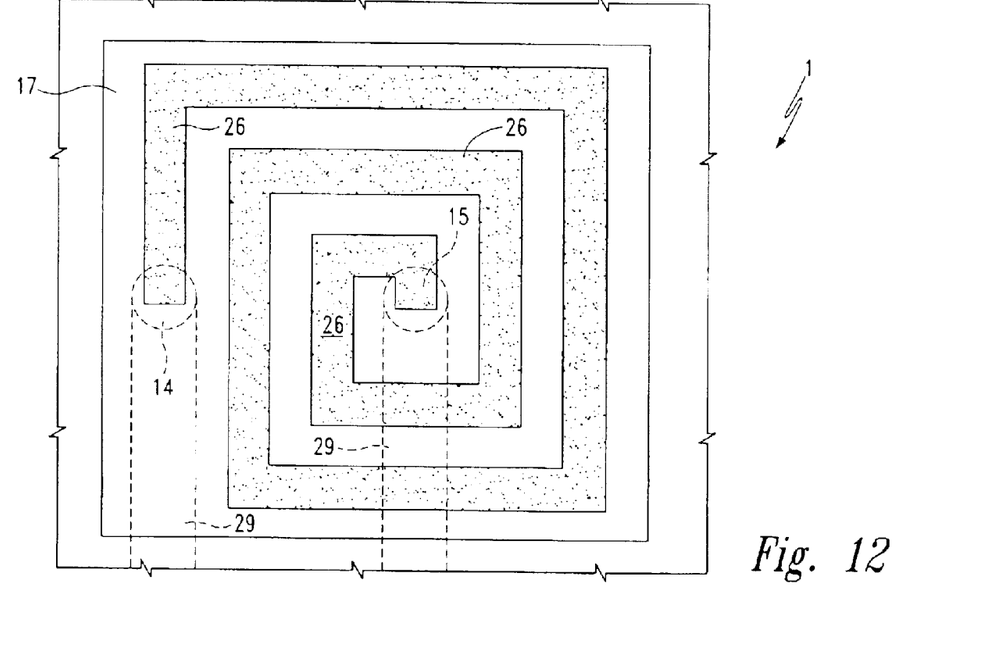
FIG. 12 is a top plan view of the wafer of FIG. 11.

Next, the wafer 1 is turned upside down (FIG. 10), and a first portion 2' of the substrate 2, which is comprised between the insulating structure 17 and a second face 20 of the wafer 1 set opposite to the first face 4, is completely removed by milling. At the end of this milling step, then, the insulating structure 17 and the first conductive region 14 and second conductive region 15 are exposed and on a surface formed from the second face 20' set opposite to the first face 4 (FIG. 11). In greater detail, the insulating structure 17 is surrounded by a residual portion 2" of the substrate 2, and the thickness of the wafer 1 is substantially equal to the depth D. In addition, the conductive regions 14, 15, which traverse the insulating structure 17 throughout in a direction orthogonal to the first face 4, are electrically insulated from the residual portion 2" of the substrate 2. Consequently, also the inductor 26, which is carried entirely by the insulating structure 17 and is directly connected only to the conductive regions 14, 15, is electrically insulated from the residual portion 2" of the substrate 2. In addition, in the embodiment of the invention here described, the inductor 26 and the electronic circuits 18 are formed on one and the same face of the wafer 1, namely on the first face 4.

Next (FIGS. 11 and 12), on the second face 20' of the wafer 1, conductive lines 29 are formed for supplying the inductor 26 through the first conductive region 14 and second conductive region 15. In greater detail, an adhesive layer of conductive material is deposited and defined so as to form tracks 31, one of which forms a contact with the first conductive region 14 and the other with the second conductive region 15. Next, by pressing metal material, projecting contacts or "bumps" 32 are formed, which adhere to the tracks 31. Finally, the wafer 1 is turned upside down again for possible processing steps (for example, the wafer 1 may be bonded to another wafer—not shown—by means of the bumps 32, according to a so-called "wafer-bonding technique").

Figure 13:
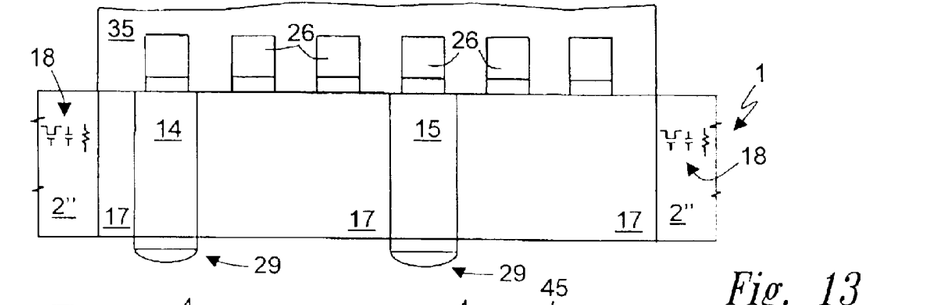
FIG. 13 is the same view as FIG. 11, in a subsequent step of fabrication of the wafer.

In one variant of the process that forms the subject of the present invention, the inductor 26 is englobed in an insulating layer 35 of dielectric material, for example silicon dioxide, which is deposited before the conductive lines 29 are formed (FIG. 13).

According to another variant, the inductor 26 and the integrated circuits 18 are formed on the opposite faces 4, 20' of the wafer 1. In this case, the wafer 1 is milled immediately after the insulating structure 17 has been formed and before fabrication of the integrated circuits 18 and the inductor 26.

The process described herein affords the advantages illustrated in what follows. First, the insulating structure 17, which is made of thermal oxide, has itself excellent dielectric characteristics which enable decoupling of the inductor 26 from the conductive portions of the wafer 1, such as residual portion 2" of the substrate 2. In addition, the substrate 2' that underlies the insulating structure 17 is completely removed, and hence no dispersions nor inductive couplings linked to eddy currents can occur, which, instead, are normally present when there remains a conductive substrate. Also electromagnetic coupling between the conductive lines 29 and the inductor 26 is substantially absent, in so far as the thickness of the insulating structure 17 is very large (in the example, 100 μm).

Second, for forming the insulating structure 17, standard processing steps for manufacturing integrated circuits are exclusively used. Consequently, the process is, on the one hand, compatible with the fabrication of integrated circuits in the residual portion 2" of the substrate 2, and, on the other, has a contained cost and acceptable execution times. In particular, for forming the insulating structure 17 no prolonged oxidation steps are required, since it is sufficient to erode the walls 8 and fill the trenches 9, 11, 12, which have a thickness of a few micron.

In addition, because of the high decoupling of the insulating structure 17, it is possible to fabricate integrated inductors having a high figure of merit and small overall dimensions.

According to an embodiment of the invention, the process is used for the fabrication of a power device, in particular a bipolar transistor, integrated in a wafer of semiconductor material together with other active and passive electronic components.

Figure 14:
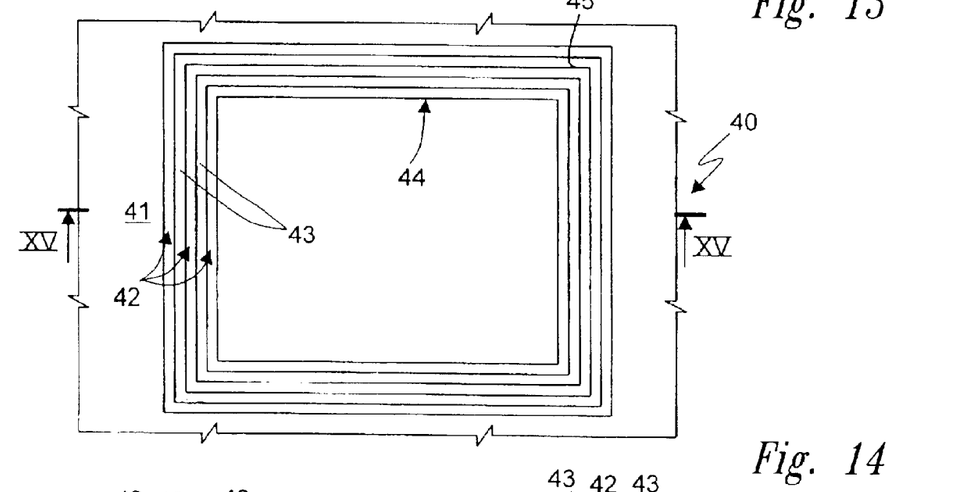
FIG. 14 is a top plan view of a wafer of semiconductor material, in an initial fabrication step, in a second embodiment of the present invention.
Figure 15:
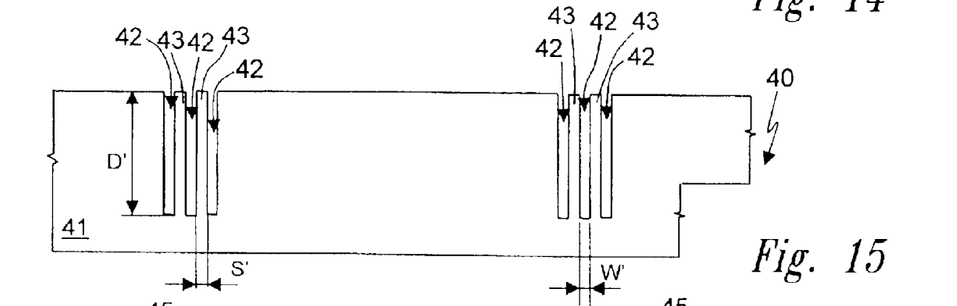
FIG. 15 is a cross-sectional view of the wafer of FIG. 14 according to a plane of trace XV—XV.

As shown in FIGS. 14–19, a wafer 40 of monocrystalline silicon, for example of N type conductivity, comprises a substrate 41, which is initially opened by means of a deep trench etch, to form a plurality of trenches 42 set alongside one another. The trenches 42, which have a depth D' of, for instance, 100 μm, are substantially developed along respective concentric closed polygonal lines, preferably forming squares or rectangles. The trenches 42 are open on a first face 44 of the wafer 40, and in pairs define walls 43. The trenches 42 and the walls 43 respectively have a width W' and a thickness S' which are equal to one another (e.g., 2.5 μm) and form a frame-like grid 45 (FIGS. 14 and 15).

Figure 16:
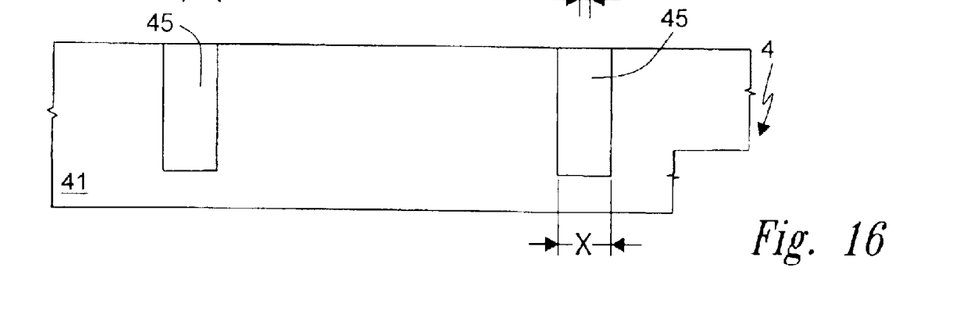
FIG. 16 shows the same view as FIG. 15, in a subsequent step of fabrication of the wafer.
Figure 17:
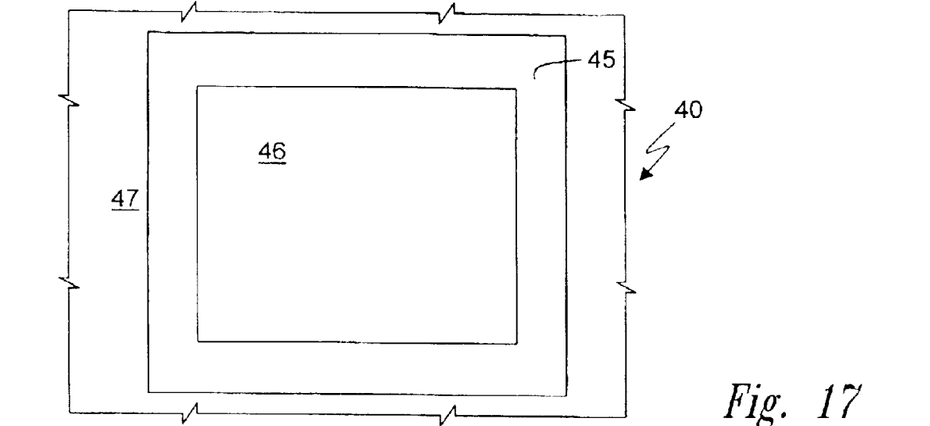
FIG. 17 is a top plan view of the wafer of FIG. 16.
Figure 18:
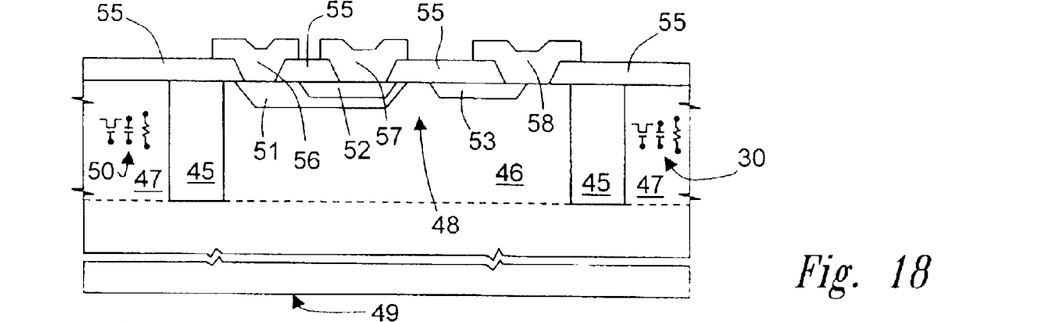
FIGS. 18–20 show the same view as FIG. 16, in subsequent steps of fabrication of the wafer.
Figure 19:
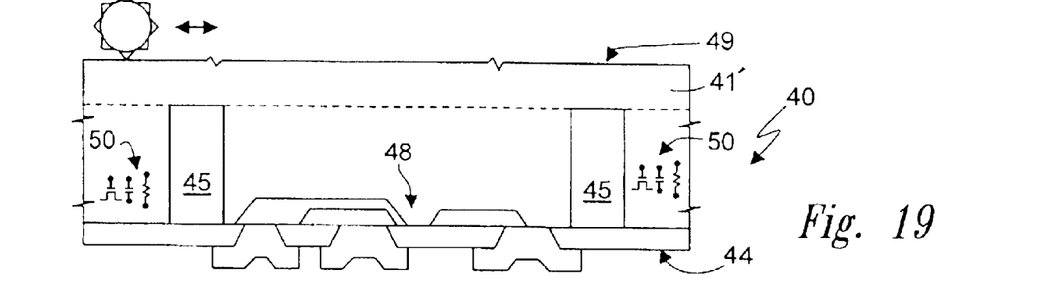

Next, the walls 43 are completely oxidized by thermal oxidation. Since the width W' of the trenches 42 is equal to the thickness S' of the walls 43, and, as mentioned previously, the thermal oxide substantially grows for one half inside the silicon of the walls 43 and for one half on the interior of the trenches 42, in this thermal oxidation step, the trenches 42 are completely filled with silicon dioxide (FIGS. 16 and 17), and the walls 43 are substantially composed of silicon dioxide Consequently, at the end of thermal oxidation, a silicon-dioxide insulating structure 45 is formed, which has a frame-like shape and has a height substantially equal to the depth D' and a total width X of the sum of the widths and thicknesses of the trenches 42 and walls 43, respectively, as shown in FIG. 16.

Next, the wafer 40 undergoes processing steps that are standard in the micro-electronics industry for the fabrication of integrated electronic components. In particular (FIG. 18), in an internal conductive region 46, delimited by the insulating structure 45, a power transistor 48 is formed, here of a lateral bipolar type, and in an external conductive region 47, which surrounds the insulating structure 45, a driving circuit 50 for driving the power transistor 48 is formed, the said circuit being here schematically represented by means of active and passive electronic components. The power transistor 48 may be fabricated as described hereinafter. Initially, a P-type well, designed to form the base 51 of the power transistor 48, is formed in the internal conductive portion 46. Next, inside the base 51 an N$^+$-type emitter region 52 is formed and, at the same time, a collector region 53 is formed, which is also of the N$^+$ type and is embedded in the internal conductive region 46 alongside the base 51. A silicon-dioxide insulation layer 55 is then grown thermally, which is selectively etched above the base 51, the emitter region 52, and the collector region 53. Finally, respective base contacts 56, emitter contacts 57, and collector contacts 58 are formed in the openings thus obtained.

Figure 20:
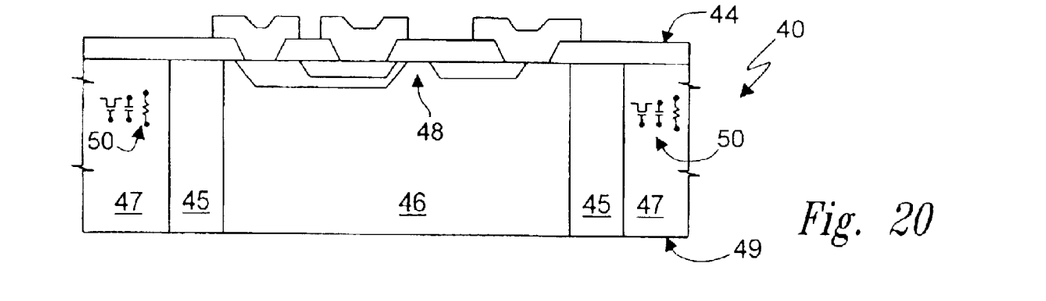

The wafer 40 is then turned upside down (FIG. 19) and is milled, so as to remove completely a portion 41' of the substrate 41 comprised between the insulating structure 45 and a second face 49 of the wafer 40, which is set opposite to the first face 44. The structure shown in FIG. 20 is thus obtained, where the wafer 40 has been turned upside down again. In practice, at the end of this step the insulating structure 45 separates the internal conductive portion 46 and the external conductive portion 47 of the wafer 40 from one another, insulating them electrically and magnetically.

Figure 21:
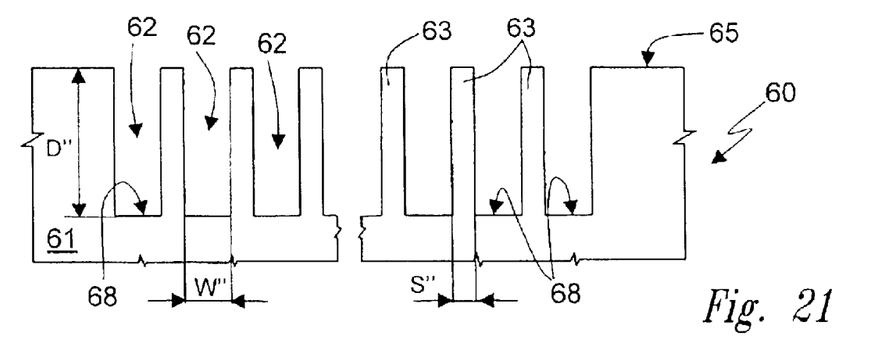
FIGS. 21–23 are cross-sectional views of a wafer of semiconductor material in successive fabrication steps, in a third embodiment of the present invention.
Figure 22:
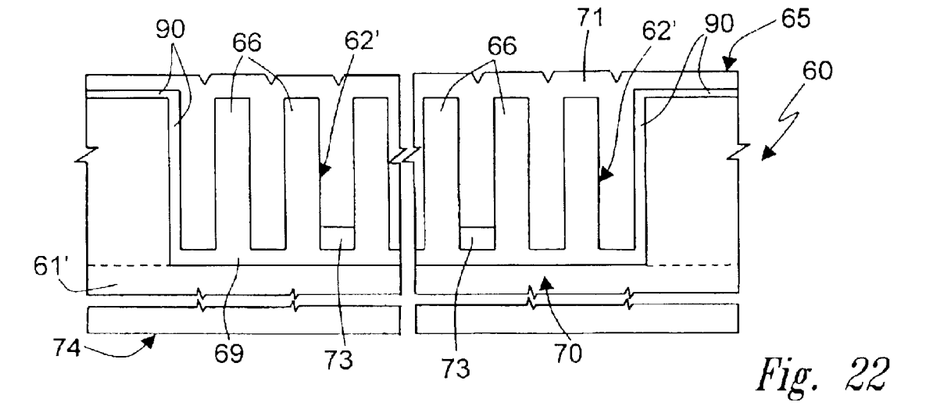
Figure 23:
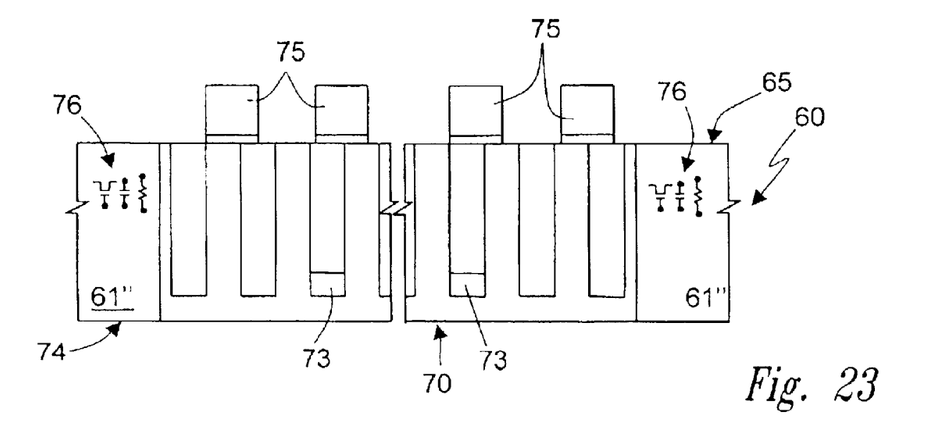

According to another embodiment of the invention, which will be illustrated hereinafter with reference to FIGS. 21–23, a monocrystalline-silicon wafer 60, comprising a substrate 61, is initially etched by means of a deep trench etch (FIG. 21). In this step, trenches 62 are formed, which are adjacent to one another and define in pairs conductive walls 63. In addition, the trenches 62, which in the present case are rectilinear, are open on a first face 65 of the wafer 60, have a depth D" of, for instance 100 μm, and a width W" not smaller than a thickness S" of the conductive walls 63. Preferably the aspect ratio W"/S" between the width W" of the trenches 62 and the thickness S" of the conductive walls 63 is between 1 and 2.

Next (FIG. 22), the wafer 60 is thermally oxidized. In this step, the conductive walls 63 oxidize completely, forming insulating walls 66, and the trenches 62 are partially filled with silicon dioxide. In fact, as explained previously, the thermal oxide grows substantially for one half inside the silicon and for one half outwards. In addition, the bottom walls 68 of the trenches 62 oxidize, and a base 69 is thus formed, which is also made of silicon dioxide and which connects the insulating walls 66 together at the bottom. In practice, at the end of the oxidation step, in the wafer 60 an insulating structure 70 is formed, which comprises the base 69, from which the insulating walls 66 project cantilevered.

In order to improve the decoupling properties of the insulating structure 70, a dielectric layer 71, for example of silicon dioxide, is next deposited on the first face 65 of the wafer 60 and fills the trenches 62', closing them. Given that the depth of the trenches 62' is much greater than their width, in this step the oxide deposited cannot fill the trenches 62' completely. Buried air bubbles 73 may thus form, which do not adversely affect the insulation provided by the insulating structure 70 and by the dielectric layer 71, as shown in FIG. 22.

The dielectric layer 71 is then etched and removed from the first face 65 of the wafer 60, which is uncovered again.

The process is then completed, substantially as already described previously. In particular, integrated circuits 76, schematically represented in FIG. 23 by means of active and passive components, are formed in the substrate 61. An electrical component, for example an inductor 75, is formed on top of the insulating structure 70, and a portion 61" of the substrate 61, comprised between the insulating structure 70 and a second face 74 of the wafer 60, set opposite to the first face 65, is removed by milling.

Finally, it is clear that modifications and variations may be made to the process described herein, without thereby departing from the scope of the present invention.

In particular, the process may be used for the fabrication of electronic devices of a different type, such as MOS-type vertical power transistors.

In addition, the insulating structure incorporated in the semiconductor wafer may have a different shape (for example, circular or annular) and may be formed starting from a grid of another type. For example, the grid could be made up of substantially square cells set alongside one another, having sides of approximately 8–10 $\mu$m and being delimited by walls having a thickness of approximately 5 $\mu$m. In addition, also the envelope of the grid, and hence the shape of the insulating structure, may be different from what is illustrated in the examples.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A process for manufacturing a semiconductor wafer integrating electronic components and a structure for electromagnetic decoupling, comprising:
   providing a wafer of semiconductor material, having a substrate;
   forming a plurality of first trenches, which are open on a first face of said wafer and have a depth and a width and define a plurality of walls that are interspersed with the first trenches such that each wall extends completely between two of the first trenches;
   by thermal oxidation, completely oxidizing said walls and filling at least partially said first trenches so as to form an insulating structure of a dielectric material; and
   removing a portion of said substrate comprised between said insulating structure and a second face of said wafer, opposite to said first face of said wafer, thereby exposing a bottom of the insulating structure opposite to said first face of said wafer.

2. The process according to claim 1, wherein said step of oxidizing and filling is followed by the step of depositing a dielectric material layer to close said first trenches.

3. The process according to claim 2, wherein said walls have a thickness, such that a ratio between said width and said thickness is substantially between 1 and 2.

4. The process according to claim 1, wherein said step of removing comprises milling said substrate.

5. The process according to claim 1, wherein said first trenches are substantially rectilinear, and in that said insulating structure has a parallelepiped shape and a height substantially equal to said depth.

6. The process according to claim 1, further comprising the step of forming through conductive vias which traverse said insulating structure in a direction orthogonal to said first face.

7. The process according to claim 6, wherein said step of forming through conductive vias comprises forming a first through conductive via in an edge portion of said insulating structure and a second through conductive via in a central portion of said insulating structure.

8. The process according to claim 7, wherein said step of forming through conductive vias comprises the steps of:
   opening second trenches having an annular shape and delimiting internally respective conductive regions; and
   filling said second trenches by thermal oxidation.

9. The process according to claim 8, wherein said step of opening second trenches is carried out simultaneously with said step of opening first trenches, and said step of filling said second trenches is carried out simultaneously with said step of filling said first trenches.

10. The process according to claim 1, wherein in said step of oxidizing and filling, said trenches are filled completely.

11. The process according to claim 10, wherein said walls have a thickness substantially equal to said width of said trench.

12. The process according to claim 10, further comprising the step of forming passive electric components which are carried by said insulating structure.

13. The process according to claim 12, wherein said step of forming passive electric components comprises forming an inductor.

14. The process according to claim 13, further comprising:
   forming first and second through conductive vias in the insulating structure, wherein said step of forming said inductor comprises the steps of:
   depositing a germ layer on one of said first face and said second face of said wafer;
   forming a resist matrix in contact with said germ layer, said matrix having a spiral-shaped opening, which has a first end in a position corresponding to said first through conductive via and a second end in a position corresponding to said second through conductive via;

galvanically growing said inductor inside said opening;
removing said matrix; and
selectively removing portions of said germ layer that are not covered by said inductor.

15. The process according to claim 14, further comprising step of forming an integrated circuit in a residual portion of said substrate that surrounds said insulating structure.

16. The process according to claim 15, wherein said inductor and said integrated circuit are formed on a same face of said wafer.

17. The process according to claim 16, further comprising the step of depositing an insulating layer of dielectric material that encloses said inductor.

18. The process according to claim 15, wherein said inductor and said integrated circuit are formed on opposite faces of said wafer.

19. The process according to claim 15, further comprising the step of forming conductive lines connected to said inductor through said through conductive vias.

20. The process according to claim 1, wherein said first trenches develop substantially along respective concentric closed lines, and in that said insulating structure has a frame-like shape.

21. The process according to claim 20, further comprising the steps of:
forming an integrated power device in a first conductive portion of said wafer inside said insulating structure; and
forming an integrated circuit in a second conductive portion of said wafer which surrounds said insulating structure.

22. The process according to claim 1, wherein said depth is substantially equal to 100 $\mu$m and said width is substantially equal to 2.5 $\mu$m.

23. A method of forming an integrated device, comprising:
forming a semiconductor substrate having opposite first and second surfaces;
forming a circuit element on the first surface;
forming a dielectric isolation region extending completely through the substrate such that the isolation region is exposed at the first and second surfaces of the substrate; and
forming a first conductive region that extends completely through the isolation region and is laterally enclosed by the isolation region, the first conductive region being electrically connected to the circuit element, wherein forming the dielectric isolation region includes:
forming a plurality of trenches that are open on the first face of the substrate, the trenches defining a plurality of walls between the trenches;
completely oxidizing the walls and filling the trenches with dielectric material.

24. The method of claim 23, further comprising forming a second conductive region that extends completely through the isolation region and is laterally enclosed by the isolation region, the first conductive region being electrically connected to the circuit element and spaced apart from the first conductive region.

25. The method of claim 24 wherein the circuit element includes an inductor having first and second ends connected respectively to the first and second conductive regions.

26. The method of claim 25, further comprising forming first and second conductive tracks on the second surface of the substrate, the first and second conductive tracks contacting the first and second conductive regions, respectively.

27. The method of claim 23 wherein
the trenches are partially filled by oxidizing the walls and filling the trenches with dielectric material further includes depositing dielectric material in the partially-filled trenches.

28. The method of claim 23 wherein the first conductive region is formed by forming the trenches completely around an internal region of the substrate and leaving the internal regions un-oxidized when oxidizing the walls to form the isolation region.

29. The method of claim 23, further comprising forming an integrated circuit in a residual portion of the substrate that surrounds the isolation region.

30. The method of claim 29, wherein the integrated circuit is formed at the first face of the substrate.

31. The method of claim 23, further comprising depositing an insulating layer of dielectric material that encloses the circuit element.

32. A process for manufacturing a semiconductor wafer integrating electronic components and a structure for electromagnetic decoupling, comprising:
forming a plurality of first trenches in a semiconductor substrate, the first trenches being open on a first face of the substrate and defining walls;
by thermal oxidation, completely oxidizing the walls and filling at least partially the first trenches so as to form an insulating structure of a dielectric material;
removing a portion of the substrate comprised between the insulating structure and a second face of the wafer, opposite to the first face of the wafer;
forming a conductive through via, extending through the insulating structure in a direction transverse to the first face, by opening a second trench in the substrate, the second trench having an annular shape and delimiting internally a conductive region of the substrate; and
filling, at least partially, the second trench by thermal oxidation.

33. The process according to claim 32, wherein opening the second trench is carried out simultaneously with forming the first trenches, and filling the second trench is carried out simultaneously with filling at least partially the first trenches.

34. A process for manufacturing a semiconductor wafer integrating electronic components and a structure for electromagnetic decoupling, comprising:
forming a plurality of first trenches in a semiconductor substrate, the first trenches being open on a first face of the substrate and defining walls;
by thermal oxidation, completely oxidizing the walls and filling at least partially the first trenches so as to form an insulating structure of a dielectric material;
removing a portion of the substrate comprised between the insulating structure and a second face of the wafer, opposite to the first face of the wafer;
forming first and second through conductive vias in the insulating structure; and
forming an inductor carried by the insulating structure, the inductor formed by:
depositing a germ layer on one of the first and second faces of the wafer;
forming a resist matrix in contact with the germ layer, the matrix having a spiral-shaped opening, which has a first end in a position corresponding to the first through conductive via and a second end in a position corresponding to the second through conductive via;

galvanically growing the inductor inside the opening;

removing the matrix; and selectively removing portions of the germ layer that are not covered by the inductor, after growing the inductor.

35. The process according to claim 34, further comprising depositing an insulating layer of dielectric material that encloses the inductor.

36. The process according to claim 34, wherein forming the first and second through conductive vias comprises:

opening second trenches each having an annular shape and delimiting internally respective conductive regions of the substrate; and filling, at least partially, the second trenches by thermal oxidation.

37. A process for manufacturing a semiconductor wafer integrating electronic components and a structure for electromagnetic decoupling, comprising:

forming a plurality of first trenches in a semiconductor substrate, the first trenches being open on a first face of the substrate and defining walls;

by thermal oxidation, completely oxidizing the walls and filling at least partially the first trenches so as to form an insulating structure of a dielectric material; and removing a portion of the substrate comprised between the insulating structure and a second face of the wafer, opposite to the first face of the wafer, wherein the first trenches develop substantially along respective concentric closed lines, such that the insulating structure has a frame-like shape.

38. The process according to claim 37, further comprising forming a first through conductive via by:

opening a second trench having an annular shape and delimiting internally a conductive region of the substrate; and filling, at least partially, the second trench by thermal oxidation.

* * * * *

UNITED STATES PATENT AND TRADEMARK OFFICE
CERTIFICATE OF CORRECTION

PATENT NO. : 6,869,856 B2  Page 1 of 1
APPLICATION NO. : 10/284031
DATED : March 22, 2005
INVENTOR(S) : Chantal Combi et al.

It is certified that error appears in the above-identified patent and that said Letters Patent is hereby corrected as shown below:

On the Title page,

Item [54], the title should read as --PROCESS FOR MANUFACTURING A SEMICONDUCTOR WAFER INTEGRATING ELECTRONIC DEVICES AND A STRUCTURE FOR ELECTROMAGNETIC DECOUPLING--.

Signed and Sealed this

Twenty-second Day of January, 2008

JON W. DUDAS
*Director of the United States Patent and Trademark Office*